United States Patent
Schleifer et al.

(10) Patent No.: US 6,587,811 B2
(45) Date of Patent: Jul. 1, 2003

(54) SYSTEM AND METHOD FOR DELAY LINE TESTING

(75) Inventors: Fred Schleifer, Prior Lake, MN (US); John Drinkard, Redwood City, CA (US); Christopher Alan Dums, Clayton, NC (US)

(73) Assignee: Scientific Technologies Incorporated, Redwood City, CA (US)

( * ) Notice: Subject to any disclaimer, the term of this patent is extended or adjusted under 35 U.S.C. 154(b) by 62 days.

(21) Appl. No.: 09/921,396

(22) Filed: Aug. 2, 2001

(65) Prior Publication Data

US 2002/0103618 A1 Aug. 1, 2002

Related U.S. Application Data

(63) Continuation-in-part of application No. 09/728,567, filed on Nov. 28, 2000, now Pat. No. 6,493,653.

(51) Int. Cl.[7] .......................... H03K 3/01; H03K 5/159
(52) U.S. Cl. ................. 702/176; 714/724; 714/815; 327/161; 327/269
(58) Field of Search .................................. 702/176, 177; 327/261, 262, 285, 161; 714/815, 724

(56) References Cited

U.S. PATENT DOCUMENTS

| 4,868,430 A | * | 9/1989 | Stewart | 327/279 |
| 6,215,345 B1 | | 4/2001 | Yashiba et al. | 327/279 |
| 6,233,528 B1 | | 5/2001 | Lin et al. | 702/69 |

* cited by examiner

Primary Examiner—Kamini Shah
(74) Attorney, Agent, or Firm—Coats & Bennett, P.L.L.C.

(57) ABSTRACT

A circuit generates a test signal useful in verifying the actual delay values of individual delay stages in a digital delay line. In general, the cumulative delay of the delay line defines a window in time having its zero point anchored to the beginning of the delay line. Successive delay stages correspond to successive time bins within the overall time window. The test signal shifts at a known, linear rate in time with respect to a reference signal, which is used to initiate a test cycle. The reference signal synchronizes sampling of the test signal to the beginning of the time window. Samples of the test signal are taken at sample points determined by the actual time delays in the successive delay stages. The observed distribution of test signal edges across the time window may be used to determine the actual delay intervals of the delay line.

32 Claims, 7 Drawing Sheets

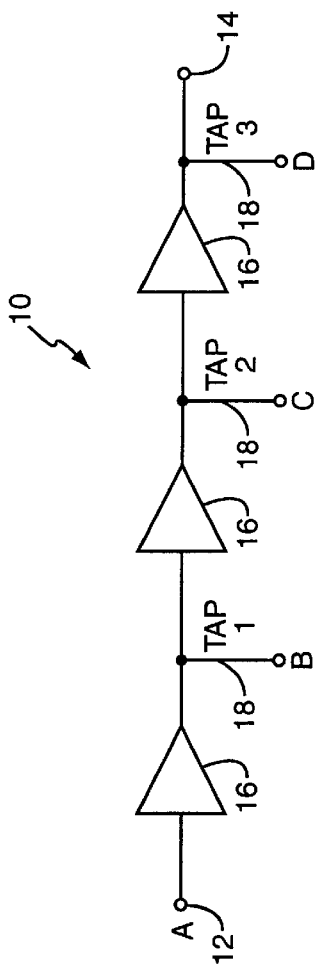
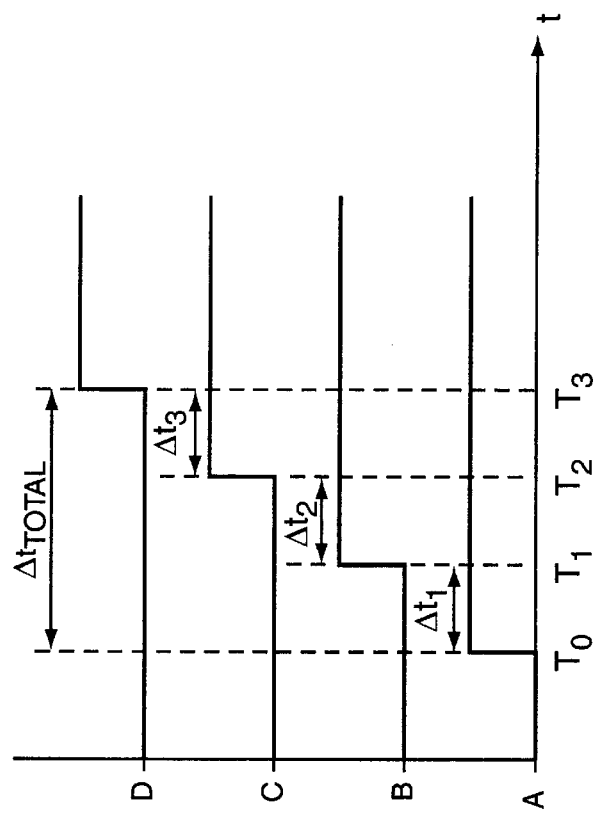

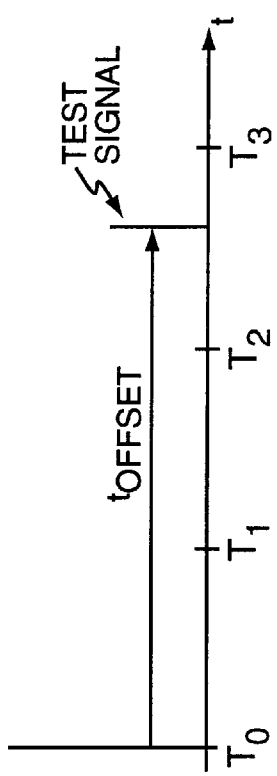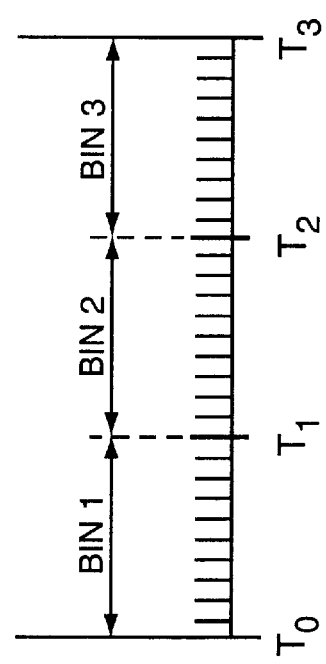
FIG. 4A
FIG. 4B

SYSTEM AND METHOD FOR DELAY LINE TESTING

RELATED APPLICATIONS

The present application is a continuation-in-part of application Ser. No. 09/728,567, filed on Nov. 28, 2000, now U.S. Pat. No. 6,493,653 and entitled "TAPPED DELAY HIGH-SPEED REGISTER," the disclosure of which is hereby incorporated by reference herein in its entirety.

BACKGROUND OF THE INVENTION

Timing circuits take on a broad range of forms and implementations, with their variety stemming from the sheer range of applications in which timing functions are required. High-resolution timing or precise frequency control applications in particular impose special design challenges, and may tax available circuit technologies when pushed beyond a given level of timing precision.

Oftentimes, the design challenge extends beyond constructing a timing circuit capable of high-resolution timing into the design of test circuits capable of characterizing and verifying performance and accuracy of the timing circuit at hand. If the timing circuit of interest is meant to measure small increments of time, say, for example, billionths or even trillionths of a second, verifying its operation poses decidedly non-trivial challenges. Factoring in the economic constraints placed on all but the most esoteric products only exacerbates the design problem.

One particular type of timing circuit is based on a digital delay line. A delay line generally comprises a circuit device that imparts a fixed or sometimes variable delay to an input waveform. Thus, a signal transition in an input waveform manifests itself on the delay line output some desired delay interval later in time.

Delay line based timing applications exploit a particular delay line implementation, in which the delay function between input and output is realized by successively connecting a chain of digital gates, each one having a characteristic delay interval, which may be the intrinsic propagation delay of the gate itself. Thus, a signal transition input to the delay line sequentially shifts or propagates through the series of interconnected gates. Each gate or delay stage is offset in time from the beginning of the delay line based on the accumulated delay between it and the first delay stage in the chain.

Each delay stage may be tapped, i.e., the stage output signal may be brought out. A propagating signal transition appears sequentially on these taps at time intervals determined by the delay interval of the corresponding delay stages. Thus, the tap signals correspond to sequential time offsets relative to the beginning of the delay line, and may be used to time certain events with a timing precision that is fundamentally limited only by the lower limits on delay stage propagation delay.

Because the time measurement precision of a delay line may approach the intrinsic propagation delay of a single electronic gate or like logic element, verifying that one or more of the delay stages meet desired time interval requirements poses significant challenges. However, in many applications where confirmation of timing accuracy is required or desirable, such as in safety critical applications, it is nonetheless necessary to devise a measurement and verification system capable of testing the timing of delay stages within a delay line.

Preferably, such a test system is flexible enough to accommodate testing over a range of required time resolutions. Further, the test system should be reliable, accurate, and inexpensive enough to include as part of the timing device that incorporates the delay line timing circuit. In this manner, the test circuit may be included within the device, thereby allowing the overall system to calibrate and self-test its delay line circuit or circuits.

BRIEF SUMMARY OF THE INVENTION

The present invention is an apparatus and method for calibrating and testing a digital delay line formed as a sequence of delay stages. A timing circuit generates a test signal that shifts in time with a precise and stable relationship to a reference signal. Sampling the test signal at time intervals based on the successive delay stages comprising the delay line in synchronization with the reference signal reveals whether individual delay stages in the delay line impart the expected or required delay intervals. Thus, the timing circuit may be used to characterize actual delay line, with the characterization information used as, for example, delay line calibration data.

Preferably, the test and reference signals are generated based on controlling a frequency offset between two frequency generators, which may be implemented as precision oscillators. A phase lock loop (PLL) or other control circuit maintains a constant frequency difference between the two oscillators. One of the two oscillators is set at a desired frequency, and the control circuit offsets the frequency of the second oscillator by the desired frequency difference.

As phase is the integral of frequency, maintaining the two oscillators at a constant frequency difference forces the two oscillator output signals to have a linearly changing phase offset, which repeatedly cycles through 360 degrees of phase offset at a rate determined by the difference frequency. Because phase shift in the frequency domain translates into time offset in the time domain, the linearly changing phase relationship causes one of the oscillator signals to shift in time relative to the other signal. The magnitude of the frequency difference between the two oscillators determines the relative time shift between the reference and test signals per cycle.

Thus, by setting the frequency difference appropriately, the second oscillator signal may be made to shift a very slight and precisely controlled amount with each cycle of the first oscillator signal. This time shift may, within the control limits of the oscillators and control circuit, be made arbitrarily small. More particularly, the resolution of the time shift depends on the ability to maintain a slight frequency difference between two oscillators, rather than depending on logic circuits operating at speeds high enough to generate time increments small enough for verifying the already tight timing of the delay line.

Dividing the frequency of the first oscillator signal to create the reference signal provides a slower signal that may be used for synchronizing the start of the delay line to the test signal. Because the reference signal is derived from the first oscillator, the relative phase of the test signal changes with each cycle of the reference signal. In this manner, the test signal shifts through a plurality of time offsets relative to the beginning time of the delay line over repeated cycles of the reference signal.

Each delay stage of the delay line represents a delay interval or time bin, with the overall delay line representing a time window. By tracking the phase offset between the oscillator signals, a test protocol may be devised that runs for a determined number of reference signal cycles, such that a test signal edge is distributed at known time intervals across the time window represented by the delay line. The test signal is recorded or sampled at discrete sample points at sample times determined by the delay stages in the delay line for each cycle of the reference signal.

Because the distribution interval of test signal edges across the time window is known, the controlling system may determine the approximate width of the time bins represented by the delay stages by counting the number of test signal edges that fall within each bin. If the time interval between accumulated test signal edges is small in comparison to the nominal or expected width the delay stage time bins, the width of the bins may be estimated with good accuracy. The time interval between the accumulated test signal edges is a function of test signal frequency relative to the difference frequency between the first and second oscillators, and the resolution with which the phase offset between the two oscillator signals is tracked.

Phase tracking may use a phase clock, which may be a digital counter with a count resolution chosen to provide the desired test signal edge interval. The phase counter clock is preferably derived from the same oscillator signal used to derive the reference signal. If the phase counter is configured with the proper count modulus or rollover value with respect to the reference signal, it may be incremented a fixed number of counts per reference signal, while still hitting every possible count value over a number of rollover cycles. This allows the reference signal, which drives test signal sampling, to cycle at a lower rate than the phase clocking rate, which may be advantageous in terms of lessening system-processing overhead.

BRIEF DESCRIPTION OF THE DRAWINGS

FIG. 1A is a diagram of a digital delay line.

FIG. 1B is a graph of the time delay function imparted by the delay line of FIG. 1A.

FIG. 4A is a graph illustrating an exemplary approach to delay line testing.

FIG. 4B is a graph illustrating an alternate exemplary approach to delay line testing.

DETAILED DESCRIPTION OF THE INVENTION

Figure 2A:
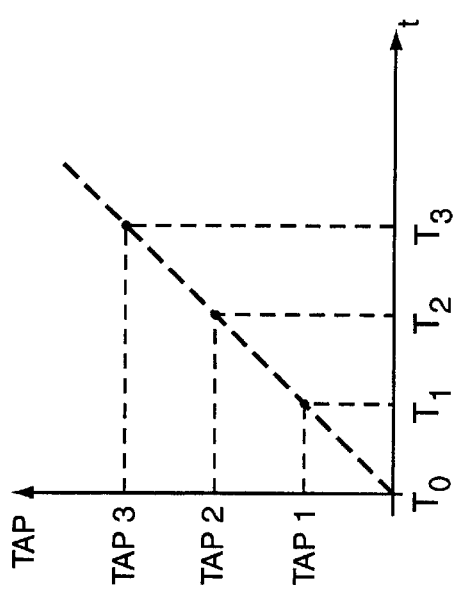
FIG. 2A is a graph of an ideal time transfer function of the delay line of FIG. 1A assuming uniform tap intervals.

FIG. 1 is a diagram of an exemplary digital delay line generally indicated by the numeral 10. The delay line 10 comprises an input 12 and an output 14, with one or more series-connected delay stages 16 disposed between the input and output. Intermediate nodes between interconnected delay stages 16 are referred to as taps 18. Each delay stage 16 imparts an incremental time delay to an input signal propagating through the delay line 10. In this manner, a signal transition on the input 12 successively manifests itself on each tap 18 in stepwise fashion as the transition propagates through the delay line 10 to output 14.

FIG. 1B illustrates the propagation behavior described above. Signal A, applied to the input 12 undergoes a transition at time $T_0$. In the illustration, this transition is a rising signal edge. The first delay stage 16 imparts a time delay to this transition, with the signal edge manifesting itself as signal B on the first delay tap 18 after an interval of $\Delta t_1$. The successive propagation of the signal edge continues on successive delay taps 18, as is illustrated by the appearance of signal edges C and D on the succeeding taps 18, spaced apart at intervals $\Delta t_2$ and $\Delta t_3$, respectively. The total time delay imparted by the delay line 10 from its input 12 to its output 14 may be represented as $\Delta t_{TOTAL}$. The interval $\Delta t_{TOTAL}$ represents a window in time.

FIG. 2A is a graph illustrating a linear time transfer function that the delay line 10 of FIG. 1A would be expected to exhibit, assuming a nominal, uniform delay interval for each delay stage 16. Time $T_0$ corresponds to the input 12 of the delay line 10, while times $T_1$, $T_2$, and $T_3$ correspond to the successive delay taps 18 that are numbered Tap 1, Tap 2 and Tap 3, respectively.

Figure 2B:
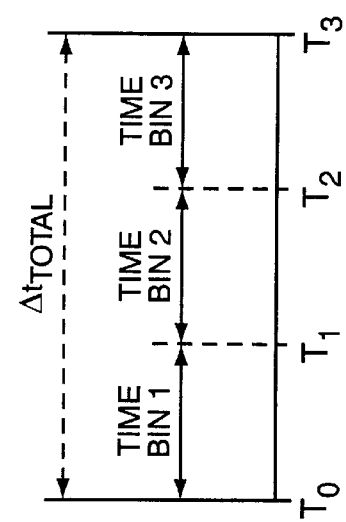
FIG. 2B is a graph of the time window represented by the delay line of FIG. 1A and illustrates the subdivision of this time window into time bins.

FIG. 2B illustrates how the time intervals between delay taps 18 correspond to time bins that subdivide the time window of width $\Delta t_{TOTAL}$ represented by the delay line 10. Again, assuming the delay line 10 exhibits uniform delay intervals across the delay stages 16, the time bins will be of uniform width. Of course, the delay stages 16 may be configured to have varying delay intervals, or manufacturing tolerances and changes in operating parameters may cause variations in the individual delay intervals. In any of these cases, the time bins illustrated in FIG. 2B would take on varying widths in accordance with the non-uniform delay intervals of the corresponding delay stages 16.

While digital delay lines find many uses across a broad range of applications, a novel use is illustrated in the earlier incorporated '567 application, which is entitled "TAPPED DELAY LINE HIGH-SPEED REGISTER." As will be discussed in more detail later, this co-pending application illustrates using a high-speed digital delay line in laser-based distance measurement systems. In such applications, a digital delay line measures time intervals between emitted laser pulses and return pulse reflections. The time interval between these events corresponds to a reflecting object's distance.

Figure 3:
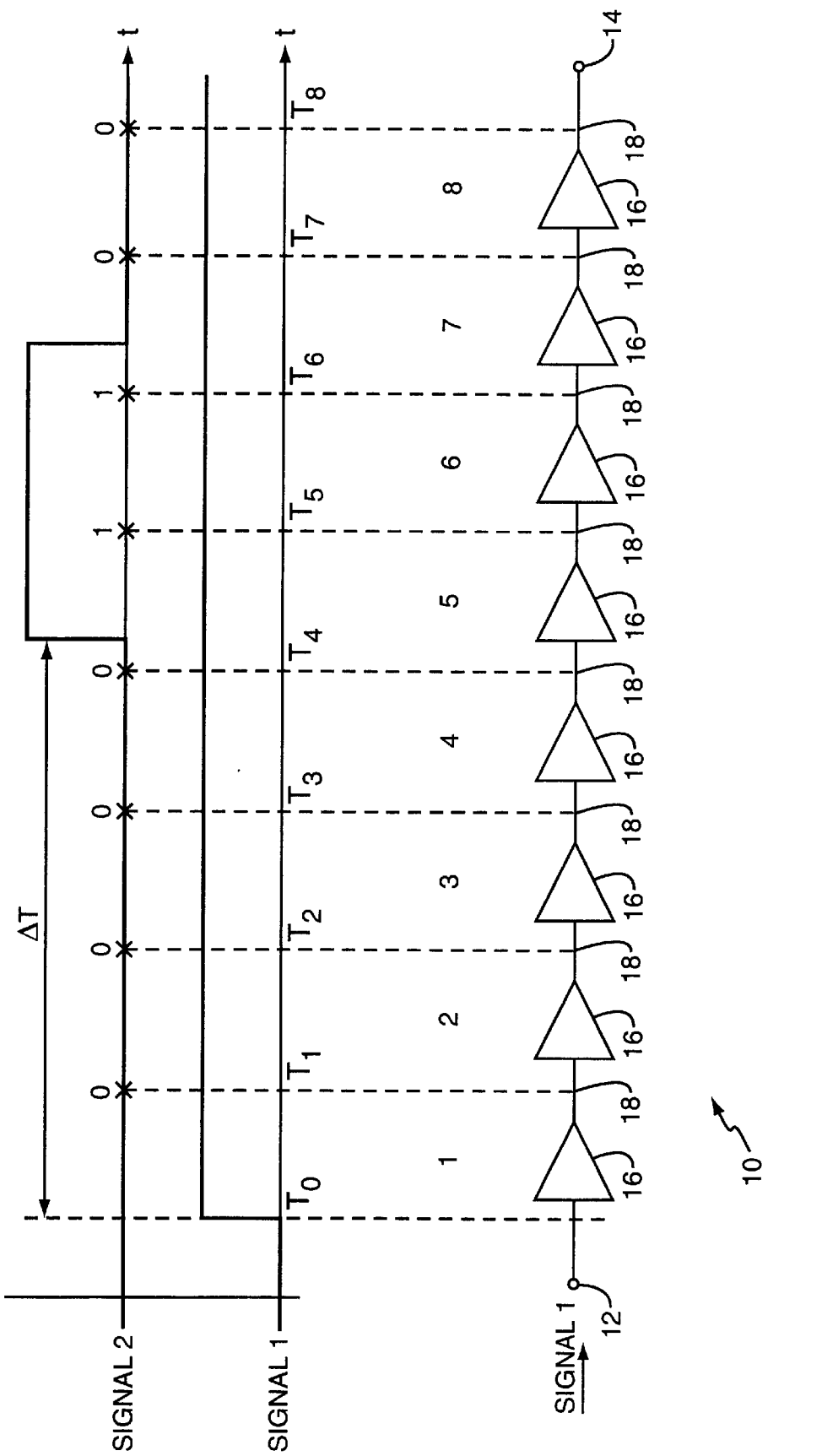
FIG. 3 is a diagram illustrating how a delay line implemented in accordance with FIG. 1A may be used to time signal offsets.

Time interval measurement is illustrated in FIG. 3, where signal 1 serves as the input to the digital delay line 10, the timing of which is used to determine the relative offset $\Delta t$ between the rising edge of signal 1 and a rising edge of signal 2. Of course, the delay line 10 may also be used to determine other time offset parameters, such as the pulse width of signal 2 or the relative offset of its falling edge.

In general terms, the desired time offset determination is made by sampling signal 2 at discrete time intervals determined by the delay intervals of successive delay stages 16 in the delay line 10. This may be accomplished by, for example, using the output signals of the delay taps 18 in the delay line 10 to control discrete sampling of signal 2. FIG. 3 illustrates this by showing discrete sampling points marked by "X" on the signal 2 axis.

As shown, signal 2 remains low for samples $T_1$ through $T_4$. Samples $T_5$ and $T_6$ capture high values of signal 2, while the final two samples at $T_7$ and $T_8$ record low values for signal 2. Because the nominal delay interval of each delay stage 16 is known, determining the relative time offset of any tap 18 within the delay line 10 relative to the beginning of the delay line 10 is a simple matter of accumulating the intervening delay intervals. Thus, the offset of sample point $T_5$ is the sum of the nominal delay intervals from sample point $T_0$ up to sample point $T_5$.

Referring back to the time bin concept introduced in FIG. 2B, the rising edge of signal 2 falls within time bin 5. Because the relative positioning of the signal edge within time bin 5 is known only to be between sample point $T_4$ and sample point $T_5$, it may be advantageous to simply assume as a matter of calculation that the signal edge transition occurred at the mid-point of time bin 5.

Of course, these calculations are based on the nominal delay intervals of the successive delay stages 16. If the actual delay intervals of the delay stages 16 deviate from the nominal or expected delay values, then the apparent delay offset of the signal edge will differ from the actual or true offset. That is, if the actual delay intervals of the delay line 10 are not as expected, then the apparent offset position of signal 2's rising edge with respect to that of signal 1 will differ from its actual offset relationship, causing a measurement error.

Verifying the timing of delay line 10 requires verification of the time bin widths corresponding to the successive delay stages 16. Characterization of the time bin widths corresponding to the successive delay stages 16 allows a controlling system to compensate time interval measurements made using nominal delay line timing. Rather than basing calculations such as accumulated delay offset on the nominal or theoretical bin widths, compensated calculations may be made using characterized or measured bin widths.

FIG. 4A shows an exemplary approach in accordance with the present invention to testing or characterizing a delay line. A test signal is generated so that one or more signal transitions may be precisely positioned at desired offsets ($T_{OFFSET}$) relative to the beginning of the delay line 10. Thus, a controlling system could use the delay line 10 to determine the apparent offset of the test signal and then compare this to the known offset. By moving the test signal transition across the delay bins, the controlling system could identify any variations in delay line timing across the successive delay stages 16.

FIG. 4B illustrates an alternate approach that builds on the above concept and provides comprehensive delay line testing in accordance with the present invention. In this approach, a plurality of test signal transitions are distributed across the time window represented by the delay line 10. If the signal transitions are uniformly distributed across the time window, then each time bin of the delay line 10 should accumulate the same or substantially the same number of signal transitions. If a given time bin is wider or narrower than the nominal bin width, then that bin will collect more or fewer signal transitions than would otherwise be expected.

If the test signal transitions are distributed with appropriately small time intervals, the width of the time bins may be determined with relatively good resolution. Indeed, if the step interval of the test signal transitions is made small enough, the widths of the individual time bins may be resolved to within an essentially arbitrary fraction of the nominal bin widths.

Figure 5:
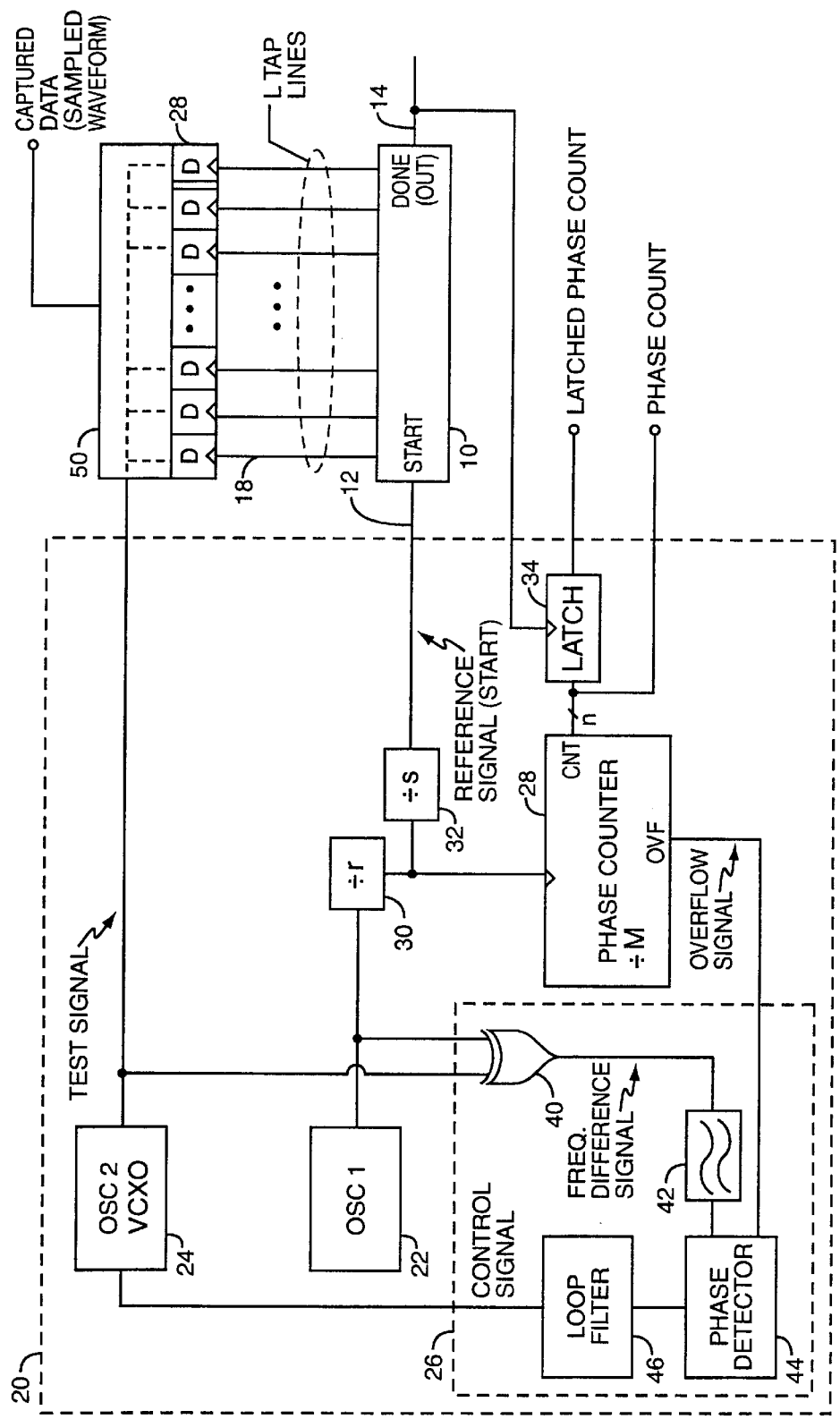
FIG. 5 is a diagram of an exemplary test circuit for testing delay lines.

FIG. 5 is a diagram of an exemplary test circuit 20 which may be used to characterize and test a delay line. The test circuit 20 comprises first and second frequency generators 22 and 24, a control circuit 26, a phase counter 28, a first divider 30, a second divider 32, and a phase count latch 34.

Frequency generators 22 and 24 may be implemented as first and second oscillators 22 and 24. Oscillator 22, termed a "timebase oscillator" serves as a reference frequency generator and is configured to generate an output signal at a desired frequency. The frequency of the output signal from oscillator 22 is chosen based on a number of considerations, which include the number of test signal cycles that are desired for the time window represented by the delay line 10. The control circuit 26 locks oscillator 24, termed a "calibration waveform" oscillator, a desired frequency offset away from the output frequency of oscillator 22. By locking the frequency of oscillator 24 a fixed offset away from the frequency of oscillator 22, the test signal output from oscillator 24 has a known linear phase relationship to the output signal from oscillator 22.

In an exemplary implementation discussed in more detail later herein, the frequency of oscillator 22 may be fixed at 24.9985 MHz, and the output frequency of oscillator 24 may be set 1.5 KHz above this basic frequency, to produce a test signal frequency of 25.0000 MHz. It should be understood that oscillator 22 may be set to a range of other values, with oscillator 24 offset in value from that of oscillator 22 by the desired frequency difference.

The phase counter 28 is used to track the phase offset of the output signal from oscillator 22 and the test signal output by oscillator 24. The output of oscillator 22 is divided down by a divisor "r" in divider 30 to generate a phase clock signal. The phase clock signal drives the input of the phase counter 28, which counts through to its maximum count value, overflows, and repeats. The overflow value or modulus of the phase counter 28 is chosen to generate the desired difference frequency (e.g., 1.5 KHz) between the oscillator 22 and the oscillator 24.

Thus, the overflow signal from the phase counter 28 serves as the reference frequency signal for a phase detector 44 within the control circuit 26. Phase detector 44 receives the measured difference frequency between oscillator 22 and oscillator 24 as its error term input. This frequency difference signal is generated by an XOR gate 40 or similar mixer such as a diode mixer, whose beat frequency output signal passes through a low pass filter 42 before being coupled to phase detector 44. The output of phase detector 44 passes through a loop filter 46 to produce a suitable control signal for oscillator 24, which may be implemented as a voltage controlled crystal oscillator (VCXO).

The phase clock signal is further divided by divider 32, which has a divisor "s". The output of divider 32 is taken as the reference signal for the delay line 10. That is, the reference signal from the divider 32 serves as the start or synchronization signal for measuring the test signal using the timing of delay line 10. With each cycle of the reference signal, the test signal shifts by a known amount. This shifting between the reference and test signals arises from the linearly changing offset between the output signals of oscillators 22 and 24.

The phase counter 28 may be used to track this phase offset. The phase counter may be read directly, or the count value may be latched into latch 34 based, for example, on the output of the delay line 10. If the phase counter 28 is read directly, a controlling system should read it before its count changes with respect to the current reference signal test cycle. It may be more convenient to use the output signal from the delay line 10 to latch the phase count value in latch 34 so that the controlling system can come back anytime before the next reference signal test cycle and read the phase count.

Figure 6:
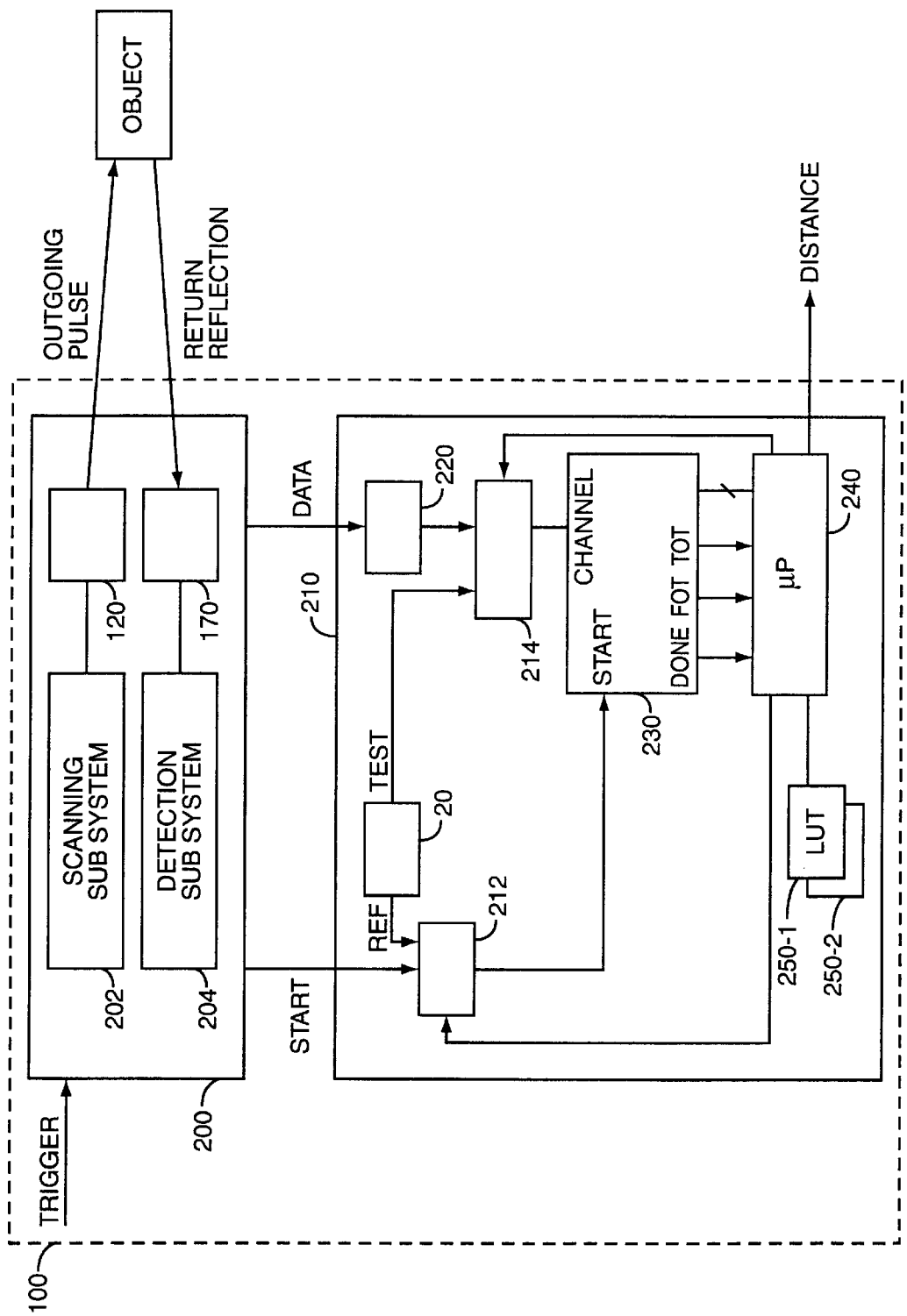
FIG. 6 is a diagram of the delay line test circuit of FIG. 5 in an exemplary distance measuring system.

As was earlier noted, interval measurement has many applications, including laser-based distance measurement. FIG. 6 is a simplified diagram of a laser-based distance measuring system 100 in accordance with the '567 application previously incorporated. The system 100 emits laser pulses at timed intervals. These pulses are angularly distributed across a desired field of view and objects within that field of view provide return reflections that are detected by the system 100. Determination of distance to the detected objects requires the system 100 to determine the time of flight of the individual laser pulses. Here, time of flight refers to the total flight time of an emitted laser pulse and includes the combined travel times of the emitted and reflected pulses.

System 100 comprises a laser control and detection system 200, and a time of flight measurement system 210. System 200 comprises a scanning subsystem 202 and laser-emitting device 120, along with a detection subsystem 204 and a laser detection device 170.

In operation, system 200 provides a start pulse to measurement system 210 upon firing of the laser device 120. System 200 subsequently provides a data pulse to the measurement system 210 in response to receiving reflected laser energy on the detection device 170. Simplistically, the time interval between the start and data pulses represents the flight time of the emitted laser pulse, although this measurement may be subjected to one or more compensation techniques that improve measurement accuracy. Some of these techniques will be discussed later herein.

Measurement system 210 comprises signal switches or multiplexers 212 and 214, an input comparator block 220, a tapped delay line high-speed register (TDLR) 230 that includes a digital delay line similar to the delay line 10 discussed earlier, a logic controller 240 that may be a microprocessor or the like, and look-up tables 250-1 and 250-2 that may be memory devices accessible to the controller 240 that contain compensation and characterization data used by the controller 240 to compensate distance measurements made by the measurement system 210. For example, the look-up table information may include delay characterization for the TDLR 230 developed in accordance with the present invention. This stored characterization information may be used by the controller 240 to compensate or correct raw time-of-flight measurements made with the TDLR 230.

Measurement system 210 is setup to measure the time interval between the start and data pulses from system 200 during distance measurement operations, or to measure the interval between reference and test signals during testing and calibration operations. These latter signals are internally generated by system 210 using the exemplary test circuit 20 discussed earlier, or other test circuit implementation with like capabilities. The signal multiplexers 212 and 214 preferably operate under control of controller 240, which switches them between the actual time of flight measurement signals (start and data) and the reference and test signals output by the exemplary test circuit 20.

In this manner, the TDLR 230 may be used to sample data signals representing reflected laser pulses after the data pulses are conditioned by the comparator block 220, or the TDLR 230 may be used to sample the test signal generated by the test circuit 20. In the former case, sampling is synchronized to the start signal generated by system 200, while in the latter case sampling is synchronized to the reference signal generated by the test circuit 20.

Figure 7:
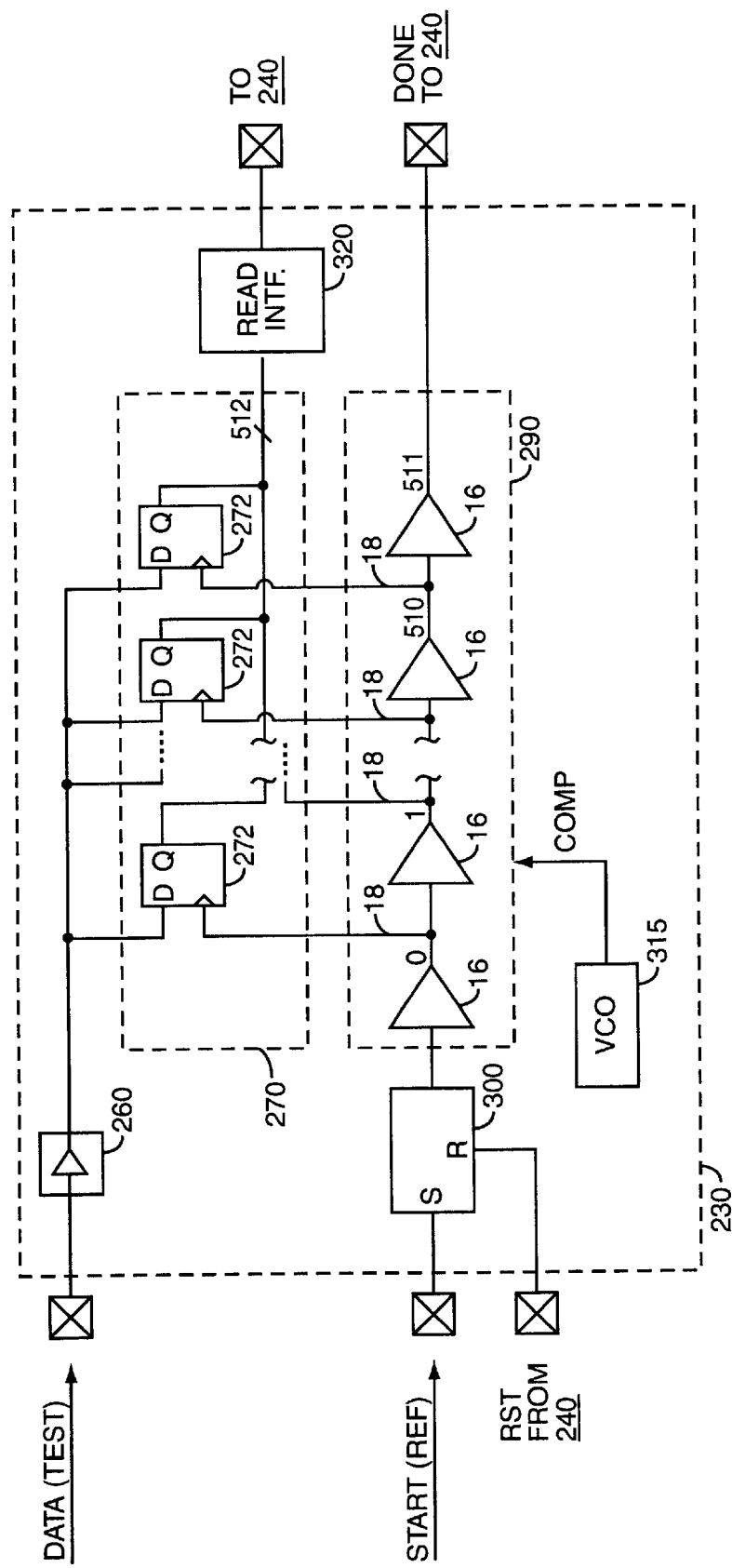
FIG. 7 is a simplified diagram of a tapped delay line register used in the distance measuring system of FIG. 6, which may be tested in accordance with the present invention.

FIG. 7 is a simplified diagram of the TDLR 230 used in the time interval measurement system 210. It comprises an input gate 260, at least one capture register or channel 270, a tapped delay line 290, a delay line gross compensation circuit 315, and a read interface circuit 320.

In operation, a start pulse from the system 200 or a reference pulse from the test circuit 20 initiates the delay line 290. The input latch 300 serves to provide the delay line 290 with a clean input pulse, and prevents input pulse ringing from propagating multiple input transitions through the delay line 290. The input transition (edge) propagates down delay line 290 via the successively interconnected delay stages 16. The output lines from taps 18 in the delay line 290 drive individual flip-flops or other types of capture registers 272 within the capture channel 270. The data inputs of the flip flops 272 are connected in parallel to the output of the inverter 260 which provides the requisite drive capability for distributing the input signal of interest, either the data pulse from system 200 or the test signal from circuit 20, to the parallel set of capture registers 272.

The output of the delay line 290 is referred to as the "DONE" signal, and notifies the controller 240 that a capture cycle is completed. Upon receiving such notification, the controller 240 may read out the contents of the capture channel 270 (or channels 270) via the read interface 320. In some implementations, the read interface includes buffering and logic control signals compatible with conventional microprocessor data bus control schemes, so that the TDLR 230 may be accessed and controlled as a memory-mapped peripheral device.

As will be noted from the diagram, the delay line 290 preferably comprises a relatively large number of delay stages 16. In preferred implementations, the delay line 290 has several hundred stages. The illustration depicts 512 stages. The short delay time of each delay stage 16, combined with the desire to measure reasonable object distances (i.e., reasonably long time-of-flight values) dictate that a sizeable number of delay stages 16 be used.

For example, the TDLR 230 may be implemented with nominal tap delay times (delay stage intervals) of 250 pico seconds (ps) to achieve a desired distance measurement resolution, with 512 successive delay stages 16 implemented in the delay line 290 to achieve the desired maximum distance measurement capability. At $3.0 \times 10^8$ m/s, light travels roughly 0.075 m per tap 18 of the delay line for 250 ps tap-to-tap delays. With 512 delay stages 16, this gives a maximum object distance measurement capability of approximately 19.2 m. Of course, parameters of the delay line 290 may be varied in accordance with the needs of a specific application.

While the delay line 290 may be controlled or compensated to hold its designed-for timing parameters in gross, such as through a voltage-controlled oscillator circuit 315 that regulates voltage or current bias to the delay stages 16, there will still likely be variations in delay intervals across the delay stages 16. This means that one or more time bins between taps 18 will exhibit non-uniform widths. Measurement system 210 may use the test circuit 20 to characterize time bin non-uniformity and thus compensate any time interval measurements made using the delay line 290.

In such testing, the test circuit 20 provides a test signal that, over a number of test cycles, shifts a test signal edge through a plurality of uniformly spaced time offsets relative to the beginning of the delay line 290, such that captured samples of the test signal in the capture channel 270 may be used to determine the actual time bin widths of the individual delay stages 16 in the delay line 290. That is, by distributing test signal edges uniformly across the time window represented by delay line 290 using a time base (i.e., the test circuit) that is independent of the delay line timing, deviations in the nominal or expected delay line timing are revealed. The deviations, as earlier noted, may be recorded, such as in look-up tables 250-1 and 250-2, and used to compensate actual time-of-flight interval measurements made using the delay line 290.

In an exemplary configuration for testing the delay line 290, oscillator 22 is set at 24.9985 MHz, with oscillator 24 set 1.5 KHz above that baseline frequency. Phase counter 28 is configured for a rollover count that yields the desired difference frequency of approximately 1.5 KHz. Thus, for a phase clock of 3.125 MHz (i.e., "r" of divider 30 is 25/3.125=8), the rollover count is set at 2027, yielding a rollover frequency of 1.546 KHz. Control circuit 26 thus locks oscillator 24 1.546 KHz above the output frequency of oscillator 22.

The phase counter counts the phase offset through each 360 degree phase cycle between the test signal output from oscillator 24 and the output signal of oscillator 22. Thus, phase step resolution (phase steps per cycle) is the reciprocal of the rollover count value, which in this example is given as 1/2027. With the phase step resolution, the time offset between the two oscillator signals per phase step is given as, $$\Delta t = \frac{1}{(25 \text{ MHz})(2027 \text{ phase steps/cycle})} = 19.7336 \text{ ps/phase step.} \quad \text{(Eq. 1)}$$

The above expression establishes the basic time step resolution of the test signal fed into the delay line 290 during testing and characterization. Of course, the actual values selected for oscillator frequencies, rollover counts, and divider values may all be adjusted as needed to produce different testing parameters if desired.

The reference signal is derived from the phase clock signal (i.e., derived from the output of divider 30). By deriving the reference signal from the phase clock, the reference signal has a known linearly changing phase relationship with the test signal. The reference signal is generated by dividing the phase clock signal by a divisor "s" in divider 32. Thus, the reference signal is at a lower frequency than the phase clock. In so doing, the phase counter 28 steps through "s" counts per reference signal cycle. This provides a reasonable period between reference signal cycles (i.e., test cycles) for the controller 240 to read out the test data from TDLR 230.

Although the phase counter 28 steps "s" counts per reference signal cycle, the rollover value of the phase counter 28 and the divisor "s" are chosen such that the phase counter 28 steps through all possible phase count values before individual count values repeat. For the exemplary values given, this entails choosing the rollover count to be odd, and such that it is not a multiple of 61, because 2 and 61 are prime factors of the exemplary value of 122 for "s." Thus, during a full test or characterization of the delay line 290, the phase counter 28 rolls over repeatedly, with each rollover cycle corresponding to one set of unique phase count values. These sets are accumulated until the combined sets of count values cover all possible count values and, therefore, the test signal offset takes on all relative offset positions corresponding to the count values.

As an illustration, assume that on a given reference signal cycle, the phase counter 28 counts 0, 122, 244, . . . , 1952, then on the next cycle it counts 47, 169, . . . , 1999, and so on, each cycle beginning with a different number between 0 and 121 inclusive. After a given number of reference signal cycles, the phase count latch 34 will have latched all possible phase count values, and the test signal edge will have taken on the full range of desired time offsets relative to the beginning of the time window represented by the delay line 290, which is anchored to the reference signal. Thus, the controller 240 will have accumulated multiple sample sets of test signal captures via the TDLR 230 that may be analyzed to determine the actual time bin widths of the individual delay stages 16 in the delay line 290.

That is, with each reference signal cycle, the rising and falling edges in the test signal shift by a known amount relative to the reference signal due to the fixed frequency offset between oscillators 22 and 24. By locking the TDLR's sampling of the test signal to the reference signal, these rising and falling edges of the test signal gradually shift through the time window represented by the delay line 290. Thus, with each succeeding capture of the test signal, these test signal edges are captured in different ones of the capture registers 272. Once the test signal edges are allowed to shift through all the phase count positions (e.g., 2027 relative offsets in the above example), the controller 240 may determine the approximate actual delay interval of each delay stage 16 by determining how many test signal edges were captured in the time bins defined by the delay taps 18.

In accordance with the above, a full set of test data is referred to as a calibration set and comprises multiple reference signal test cycles, with a capture data set or sample set of the test signal taken for each reference test cycle. By running the appropriate number of reference signal test cycles, a capture data set of the test signal is obtained for each unique phase count, which would be 2027 capture data sets in the above example. Note that these capture data sets represent interleaved data sets, representing the multiple phase counter rollovers. Thus, while the count value latched by phase count latch 34 steps by "s" phase counts per reference signal test cycle, it will have stepped through all unique phase count values over "M" reference signal test cycles. This yields test signal edge steps of the desired resolution, here 1/(25 MHz)/2027 counts, or 19.73 ps per phase count.

With a nominal bin width represented as the time between successive delay taps 18, each time bin has a nominal or expected width of 250 ps. Of course, the delay line 290 may be implemented with shorter or longer delay intervals, and with intentionally non-uniform bin widths in some applications. In any case, distributing the test signal edges in uniform, known time steps accommodates all such variations and allows the controller 240 to characterize the actual delay line timing behavior on an individual delay stage basis. Refer back to FIG. 4B for a depiction of test signal edge distribution across a given delay line time window.

In an exemplary approach, the controller 240 captures the test signal, referred to as capturing a calibration waveform, for each unique phase count, to form a calibration data set. It then determines calibration information for the TDLR 230 based on this callibration data set. For example, the controller 240 may build a delay bin map of the TDLR channel 270 (or channels 270) for both rising and falling edges of the test signal in the calibration waveforms. The delay bin map is conceptual; in actuality the controller 240 may process much of the information immediately after each test signal acquisition rather than saving it in its full detail.

The map for rising edges on one channel may look something like the following. A similar map exists for falling edges.

TABLE 1

Calibration Data Set Delay Bin Map

| Phase | TDLR Time Bin Number | | |
|---|---|---|---|
| Index (n) | 1st edge | 2nd edge | 3rd edge |
| 0 | 2 | 206 | 434 |
| 1 | 2 | 206 | 434 |
| 2 | 2 | 206 | 434 |
| 3 | 2 | 206 | 434 |
| 4 | 2 | 206 | 434 |
| 5 | 1 | 206 | 434 |
| 6 | 2 | 206 | 434 |
| 7 | 2 | 206 | 434 |
| 8 | 1 | 206 | 434 |
| 9 | 1 | 205 | 434 |
| 10 | 1 | 205 | 433 |
| 11 | 1 | 205 | 433 |
| 12 | 1 | 205 | 433 |
| 13 | 205 | 433 | — |
| 14 | 1 | 205 | 433 |
| 15 | 205 | 433 | — |
| 16 | 205 | 433 | — |
| 17 | 204 | 433 | — |
| 18 | 204 | 433 | — |
| 19 | 204 | 433 | — |
| ... | ... | ... | ... |
| 2012 | 4 | 207 | 435 |
| 2013 | 3 | 207 | 435 |
| 2014 | 3 | 207 | 435 |
| 2015 | 3 | 207 | 435 |
| 2016 | 3 | 207 | 435 |
| 2017 | 3 | 207 | 435 |
| 2018 | 3 | 207 | 435 |
| 2019 | 3 | 207 | 435 |
| 2020 | 3 | 206 | 435 |
| 2021 | 3 | 207 | 435 |
| 2022 | 3 | 206 | 435 |
| 2023 | 3 | 206 | 434 |
| 2024 | 2 | 207 | 434 |
| 2025 | 3 | 206 | 435 |
| 2026 | 2 | 206 | 434 |

Because the calibration waveform oscillator 24 runs faster than the timebase oscillator 22, larger phase indices correspond to the calibration edges appearing earlier (lower bin numbers) in the TDLR capture register 270. For this reason, bin numbers in the table generally decrease with increasing phase index. When the latched phase count 34 wraps around from 2026 to 0, there is no phase discontinuity—the test signal waveform has simply completed an entire 360 degrees of phase shift.

Noise within the system 100 may create jitter in test signal edges near the tap boundaries. If present, such jitter can cause the bin number to flip back and forth near tap boundaries.

At some point, between index 12 and 13 in the example table above, the first edge disappears beyond the beginning of the capture register 270, and the second edge (tap 205) becomes the first edge. In some cases, this break may coincidentally appear where the phase index wraps around—between index 2026 and 0.

One technique for processing the calibration data set involves summing the number of times rising (or falling) edges within a particular time bin appear in the calibration set. For example, in the table above, bin 205 appears 8 times. Therefore, for rising edges, the time delay from the 204th and 205th delay stages 16 corresponds to the width of delay bin 205, which has an approximate width of, $$\Delta t_{205} = (19.7336 \text{ ps/index})(8 \text{ index appearances}) = 157.9 \text{ ps} \quad \text{(Eq. 2)}$$

Delay bin widths of $\Delta t$ exist for $\Delta t_1$ and $\Delta t_{511}$, where $\Delta t_1$ and $\Delta t_{511}$ represent the successive time delays from the first to the last delay stages 16 comprising the delay line 290.

To obtain the absolute delay from the beginning of the delay line 290, the individual delay bin widths require an additional summing step.

$$t_n = \begin{cases} 0 & \text{if } n = 0, \\ \sum_{k=1}^{n} \Delta t_k & \text{otherwise,} \end{cases} \quad \text{(Eq. 3)}$$

where $t_n$ is the absolute delay of the nth tap 18 in delay line 290. The first tap 18, tap(0) is arbitrarily defined as having a delay of zero. This processing method is essentially an integrated histogram; however, it is based on each phase index being used only once in the histogram. If the processing method averages multiple measurement sets, then each phase index should appear exactly the same number of times for a valid histogram.

The set of $t_n$ for integers $0 \leq n \leq 511$ forms a calibration table. Because of slight timing differences in the D flip-flops comprising capture registers 272, propagation delays, and in the distribution of the delay tap signals, the controller 240 may generate separate calibration tables for rising and falling edges and for each TDLR channel 270.

The above discussion outlines a method of generating a tap-delay (calibration) table from the calibration data set. The first delay entry of the calibration table is always zero, so these delay values are really delays relative to delay tap(0), rather than representing an absolute delay. This approach works well where ranging values are calculated relative to a reference target ($t_0$) measurement because any fixed timing offset between the start signal and the data pulse cancels out. Of course, the above approach may be modified, or otherwise changed as needed or desired.

However, anchoring the calibration table to a particular phase index, and therefore to a fixed relationship between start and the captured channel data, is useful for checking that the control circuit 26 is maintaining a proper lock between oscillators 22 and 24. If properly locked, circuit 26 maintains a consistent phase relationship between the reference and test signals for each phase index. Therefore, excluding small timing drifts, the phase index to which tap(0) corresponds is substantially consistent from calibration data set to calibration data set. An improperly locked PLL may produce plausible calibration tables but will not maintain this consistent phase relationship across calibration sets.

Equation 3 above does not necessarily provide such an anchor. For that, further processing of the data in Table 1 is necessary.

Looking at the range of phase indices in Table 1 in which bin 1 appears forms the basis for Table 2.

TABLE 2

Delay Bin 1 Phase Indices

| Phase Index | Time Bin Number |
|---|---|
| 5 | 1 |
| 6 | 2 |
| 7 | 2 |
| 8 | 1 |
| 9 | 1 |
| 10 | 1 |
| 11 | 1 |
| 12 | 1 |

TABLE 2-continued

Delay Bin 1 Phase Indices

| Phase Index | Time Bin Number |
|---|---|
| 13 | 205 |
| 14 | 1 |

Jitter within TDLR 230 and test circuit 20 may cause bin numbers to alternate near bin boundaries, and consequently it may not be immediately clear which phase index corresponds to the beginning of bin 1. "Bubbling" the bin-2 appearances to lower phase indices and the bin-205 (the 205th time bin in delay line 290) appearance to a higher phase index produces the following table:

TABLE 3

"Bubbled" Bin 1 Phase Indices

| Phase Index | Bin Number |
|---|---|
| 5 | 2 |
| 6 | 2 |
| 7 | 1 |
| 8 | 1 |
| 9 | 1 |
| 10 | 1 |
| 11 | 1 |
| 12 | 1 |
| 13 | 1 |
| 14 | 205 |

Now the beginning boundary of bin 1, or equivalently, the instant of tap delay 0, is clearly demarcated as phase index 13. This phase-index anchor for the calibration table is labeled $n_{ANCHOR}$.

Simulations of calibration measurements based on this technique demonstrate a reduction in jitter in measurements of the bin-1 boundary. Thus, the technique effectively averages the few samples near the bin boundary, which reduces the apparent jitter of test circuit 20.

The spread of time bins may also be determined. For example, the apparent width of bin 1 spans seven (7) phase indices (counts of phase counter 28), which is consistent with the interpretation of bin width expressed in Equation 1. In the absence of any sampling jitter, the number of the phase indices encompassed by bin 1 should also be 7. However, the encompassed range or spread of delay bin 1 as shown in Table 2 is, $$N_{SPREAD} = n_{HIGHEST} - n_{LOWEST} + 1. \qquad (Eq. 4)$$

where $n_{HIGHEST}$ and $n_{LOWEST}$ are the highest and lowest phase indices at which bin 1 appears. In this particular example, the spread is $$N_{SPREAD} = 14 - 5 + 1 = 10. \qquad (Eq. 5)$$

The bin spread relative to the bin width gives an indication of sampling jitter and of the integrity of control circuit lock within the test circuit 20. In the absence of any circuit noise or jitter, the bin spread would equal the bin width. Normal amounts of jitter can produce a spread of a few phase indices wider than the bin width. Excessive amounts of jitter, or out-of-phase calibration samples stemming from poor timing lock in the test circuit 20 potentially create much larger bin spreads.

The method of finding the phase index anchor described above implies that the calibration procedure records the "first edge" column that appears in Table 1, which may, in some system implementations, place undesirable memory demands on the controller 240, or on its supporting circuits (not shown).

An alternate approach creates a list of phase indices that appear in bin 1. For example, Table 2 from above would be transformed as Table 4 below. In practice, the controller 240 may need to sort the entries because of the test signal samples in the calibration data set are interleaved, at least in the implementation described earlier.

TABLE 4

Bin 1 Phase-Index List

| List Element Label | Phase Indices of Bin 1 |
|---|---|
| $a_0$ | 5 |
| $a_1$ | 8 |
| $a_2$ | 9 |
| $a_3$ | 10 |
| $a_4$ | 11 |
| $a_5$ | 12 |
| $a_6$ | 14 |

The first and last entries of this list immediately define the spread of delay bin 1 using Equation 4 above.

Table 4 arguably presents less detailed information in that the missing phase indices or "bubbles" could correspond to any bin. Thus, It is not immediately clear if these missing indices should bubble up or bubble down.

Since any test circuit jitter relative to bin width of the delay line 290 will be small with proper component selection and configuration, the tails of the bordering bins' probability distributions are very small ($4\sigma$ or $3.2 \times 10^{-5}$) at the center of bin 1 for delay line 290. In selecting components for the test circuit, those skilled in the art will appreciate that the oscillators 22 and 24 should be selected based on their intrinsic jitter characteristics, and that the difference frequency is set high enough above the unity gain frequency of the control circuit 26 to allow tight loop control of the frequency of oscillator 24.

One proposed strategy assumes that bubbles within bin 1 bubble away from the center of the bin, either to higher or lower phase indices as required. A bubble rarely appears on the "wrong" side of the bin's center.

The calculation method for this technique takes the middle phase-index element of the list and adds the number of list entries below the middle element. If the list has an even number of entries, the "middle" element is arbitrarily the higher-phase-indexed element of the two middle elements.

$$n_{ANCHOR} = a_{floor(N_{width}/2)} + floor\left(\frac{N_{WIDTH} - 1}{2}\right) \qquad (Eq. 6)$$

where floor(x) is the largest integer not greater than x, which for these positive values, is equivalent to truncating the fractional portion or throwing out the remainder of an integer division.

In the above example, the anchor is $$n_{ANCHOR} = a_{floor(7/2)} + floor\left(\frac{7-1}{2}\right) \qquad (Eq. 7)$$
$$= A_3 + 3 = 10 + 3 = 13,$$

which matches the result based on Table 3.

The data of Table 2 are structured such that bin 1 does not encompass the phase-index wraparound from 2026 back to 0. Offsetting the phase indices in that table by 2020 modulo 2027 generates the following table.

TABLE 5

Offset Bin 1 Phase Indices

| Phase Index | Bin Number |
|---|---|
| 2025 | 1 |
| 2026 | 2 |
| 0 | 2 |
| 1 | 1 |
| 2 | 1 |
| 3 | 1 |
| 4 | 1 |
| 5 | 1 |
| 6 | 205 |
| 7 | 1 |

TABLE 6

Offset Bin 1 Phase-Index List

| List Element Label | Phase Indices of Delay Bin 1 |
|---|---|
| $a_0$ | 2025 |
| $a_1$ | 1 |
| $a_2$ | 2 |
| $a_3$ | 3 |
| $a_4$ | 4 |
| $a_5$ | 5 |
| $a_6$ | 7 |

However, using the entries in the above table would cause the previous algorithms to generate incorrect results. Thus, the first step is to determine if the phase indices may wrap around. If at least one element in the list is greater than $n_{3/4}=(0.75)(2027)=1520$, then the list may wrap around. The value $n_{3/4}$ is approximately three-quarters of the maximum phase index value, which is 2027 in the continuing example. If on the other hand, all of the values in the list were less than $n_{3/4}$, then the list does not wrap around and requires no special handling.

To handle a possibly wrapped list, a value of 2027 is added to each phase index that is less than $n_{1/2}=(0.5)(2027)-1013$. The list above thus conditioned becomes the following.

TABLE 7

Offset Bin 1 Phase-Index List

| List Element Label | Phase Indices of Delay Bin 1 |
|---|---|
| $a_0$ | 2025 |
| $a_1$ | 2028 |
| $a_2$ | 2029 |
| $a_3$ | 2030 |
| $a_4$ | 2031 |
| $a_5$ | 2032 |
| $a_6$ | 2034 |

In practice, a sorting operation may be desirable to bring the table elements into order.

The advantage of adding the offset to the lesser elements is that the phase-index list no longer contains a break or wraparound. Since a delay bin is relatively narrow in the current example (up to a dozen or so phase indices), the list could not have passed the original test of having at least one phase index greater than $n_{3/4}$ while still having the phase indices clustered around $n_{1/2}$. Therefore, when the offset is applied, there is no danger of creating a break around $n_{1/2}$. The only exception to this is if delay bin 1 has an unusually large spread, but in that case, the calibration data set may be recognized as invalid because of the overly large spread.

Equations 4 and 6 from above may then be used to determine the spread and anchor of the adjusted values of Table 7 as, $$N_{SPREAD} = 2034 - 202 + 1 = 10, \quad \text{(Eq. 8)}$$

and $$n_{ANCHOR} = a_{floor(7/2)} + \text{floor}\left(\frac{7-1}{2}\right) = a_3 + 3 = 2030 + 3 = 2033. \quad \text{(Eq. 9)}$$

Applying modulo 2027 to the $n_{ANCHOR}$ result brings the value back to within the normal range of phase indices. Namely, the anchor value becomes, $$n_{ANCHOR} = 2033 \bmod 2027 = 6. \quad \text{(Eq. 10)}$$

The spread obtained in Equation 8 agrees with that obtained through application of Equation 5, which demonstrates that offsetting the phase indices by 2020 does not change the calculated bin spread.

Offsetting the original anchor calculated by applying Equation 7 by 2020 modulo 2027 produces, $$(13+2020) \bmod 2027 = 6, \quad \text{(Eq. 11)}$$

which is in agreement with the result of Equations 9 and 10.

Of course, processing any or all of the calibration data set may be varied or changed from the exemplary techniques described above, as needed in a given application. More fundamentally, the above discussion exemplifies the more general concept of sampling a waveform with known timing characteristics using sampling intervals determined by a digital delay line 290, such that inspection of the sample data reveals the delay line's actual timing characteristics. Where the technique is used to step test waveform signal edges across the full set of time bins represented by the delay line 290, the actual width of each time bin may be estimated with essentially arbitrary precision.

Characterizing actual bin widths in this manner then allows the controlling system to compensate time measurements made using the delay line 290, and thus allows substantially greater measurement accuracy than otherwise obtainable. Moreover, the above techniques may be used to dynamically test the delay line 290 during system operation, and thus the timing and operational status of each delay stage 16 within the delay line 290 may be repeatedly verified during operation of the system 100. This in situ verification capability may be particularly important in safety-critical distance measuring applications of the system 100, where the system's ability to make accurate distance measurements must be repeatedly verified during operation.

As those skilled in the art will readily appreciate, the present invention is subject to much variation, and the above discussion should be considered exemplary rather than limiting. Indeed, the present invention is limited only by the following claims and their reasonable equivalents.

What is claimed is:

1. A method of testing a digital delay line comprising successive delay stages, each said delay stage having a delay time representing a time bin, such that said delay line represents successive time bins, the method comprising:

distributing a plurality of spaced apart test signal edges at known time intervals over a time window anchored to a beginning of said digital delay line, said known time intervals less than said delay times; and observing the distribution of said plurality of test signal edges based on said delay times of said one or more of said delay stages.

2. The method of claim 1 wherein observing the distribution of said plurality of test signal edges based on said delay times of said one or more of said delay stages comprises determining whether an observed distribution of said test signal edges substantially matches an expected distribution of said test signal edges.

3. The method of claim 2 wherein determining whether an observed distribution substantially matches an expected distribution of said test signal edges comprises determining whether an expected number of said test signal edges fall time wise within said time bins represented by said one or more delay stages.

4. The method of claim 1 wherein distributing a plurality of spaced apart test signal edges at known time intervals over a time window anchored to a beginning of said digital delay line comprises:

generating periodic test and reference signals, such that said test signal linearly shifts in time at a known rate relative to each cycle of said reference signal; and referencing each cycle of said reference signal to said beginning of said delay line, such that a test signal edge in said test signal shifts in time a desired amount relative to said beginning of said delay line with each cycle of said reference signal.

5. The method of claim 4 further comprising recording a sample of said test signal at sample times determined by said delay stages of said delay line for each cycle of said reference signal, such that at each cycle of said reference signal a set of test signal samples is recorded.

6. The method of claim 5 wherein observing the distribution of said plurality of test signal edges based on said delay times of said one or more of said delay stages comprises determining whether said recorded sets of said test signal samples reflect an expected distribution of said test signal edges across said time bins represented by said delay stages.

7. The method of claim 4 wherein generating periodic test and reference signals, such that said test signal linearly shifts in time at a known rate relative to each cycle of said reference signal comprises:

generating a first signal at a desired frequency;

dividing said first signal to generate said reference signal at a reduced frequency; and generating said test signal at a constant offset frequency from said first signal, such that said test signal has a known linear phase offset relative to said first signal.

8. The method of claim 7 choosing a divisor for said reference signal such reference signals are provided for delay line testing at a desired rate.

9. The method of claim 7 further comprising tracking said phase offset between said first signal and said test signal using a phase counter.

10. The method of claim 9 further comprising choosing said phase counter to have a desired count resolution, wherein said count resolution of said phase counter determines said known time intervals of said test signal edges distributed across said time window.

11. The method of claim 10 further comprising choosing a clock frequency for said phase counter such that said phase counter increments a desired number of phase counts per reference signal cycle.

12. The method of claim 11 further comprising choosing a rollover value of said phase counter such that said phase counter counts through all possible count values over a given number of rollover cycles, wherein each said count value corresponds to a time offset of said test signal edges relative to said beginning of said delay line.

13. The method of claim 11 further comprising choosing a rollover value of said phase counter such that a rollover indicator signal is generated at a desired value for said constant offset frequency.

14. The method of claim 13 further comprising using a phase locked loop (PLL) to lock said test signal at said constant offset frequency away from said first signal based on said rollover indicator signal.

15. The method of claim 1 further comprising storing timing calibration information for said digital delay line based on said observing the distribution of said plurality of test signal edges based on said delay times of said one or more of said delay stages.

16. The method of claim 15 further comprising compensating a time measurement made using said digital delay line based on said calibration information.

17. A method of testing a digital delay line comprising a series of delay stages defining successive time delays relative to a beginning of said delay line, the method comprising generating periodic test and reference signals having a desired beat frequency such that said test signal linearly shifts in time relative to said reference signal in a known manner; and measuring said successive time delays of said delay line based on said time shifts between said test signal and said reference signal.

18. The method of claim 17 wherein generating said periodic test signal comprises locking a first clock signal a desired frequency offset above a reference clock signal, wherein said frequency offset determines said beat frequency and sets a linear rate of change of phase offset between respective clock edges in said test signal and said reference clock signal.

19. The method of claim 18 further comprising generating said reference signal by dividing down said reference clock signal, such that respective clock edges in said reference signal and said test signal have a known phase offset relationship.

20. The method of claim 19 further comprising tracking a phase offset of said test signal relative to said reference signal between successive cycles of said reference signal, such that a phase offset between said reference signal and said test signal is known.

21. The method of claim 20 wherein measuring said successive time delays of said delay line based on said time shifts between said test signal and said reference signal comprises:

clocking said delay line with a plurality of cycles of said reference signal;

measuring a time offset between said reference signal and said test signal using said delay line over said plurality of cycles of said reference signal; and comparing measured time offsets to expected time offsets based on said known phase relationship between said test signal and said reference signal.

22. A method of testing a digital delay line comprising successive delay stages collectively representing a time window, and wherein said successive delay stages divide said time window into corresponding successive time bins, said testing method comprising:

generating a test signal that shifts through a plurality of time offsets at known time intervals relative to said beginning of time window;

recording samples of said test signal at sample points fixed by said delay stages of said delay line; and determining whether said recorded samples of said test signal fall within said successive time bins as expected based on said known time intervals.

23. The method of claim 22 wherein recording samples of said test signal at sample points fixed by said delay stages of said delay line comprises recording a digital sample of said test signal at each said sample point to generate a sample set, such that each said sample point corresponds to one of said successive time bins.

24. The method of claim 23 further comprising recording multiple sample sets of said test signal over a number of test cycles and determining whether an expected number of signal edges in said test signal fall within one or more of said time bins.

25. The method of claim 22 further comprising storing timing calibration information for said digital delay line based on said determining whether said recorded samples of said test signal fall within said successive time bins as expected based on said known time intervals.

26. The method of claim 25 further comprising compensating timing measurements made using said digital delay line based on said timing calibration information.

27. A circuit for generating a test signal that shifts in time relative to a reference signal at a known rate, the circuit comprising:

first and second frequency generators to generate a first signal and said test signal, respectively;

a differencing circuit to generate a frequency difference signal based on a difference frequency between said first signal and said test signal;

a control circuit to lock said test signal a desired offset frequency away from a frequency of said first signal based on comparing said frequency difference signal to a difference control signal; and a first divider circuit to generate said reference signal by dividing said first signal, such that said test signal and said reference signal have a linearly changing phase offset and corresponding time shift based on said desired offset frequency.

28. The circuit of claim 27 further comprising a counter circuit for tracking a phase offset between said first signal and said test signal.

29. The circuit of claim 28 further comprising a second divider circuit to generate a phase clock signal to clock said counter circuit at a desired clock rate.

30. The circuit of claim 29 wherein said first divider circuit comprises a divider coupled to said phase clock signal such that a frequency of said first signal is divided by said first and second divider circuits to generate said reference signal.

31. The circuit of claim 27 wherein said control circuit comprises a phase locked loop operative to generate a frequency control signal to control a frequency of said second frequency generator based on said frequency difference signal and said difference control signal.

32. The circuit of claim 31 further comprising a counter circuit to generate said difference control signal based on dividing said first signal by a desired divisor.

* * * * *